US010659017B1

(12) United States Patent
Rengarajan et al.

(10) Patent No.: US 10,659,017 B1
(45) Date of Patent: May 19, 2020

(54) LOW-POWER SCAN FLIP-FLOP

(71) Applicant: MARVELL INTERNATIONAL LTD., Hamilton (BM)

(72) Inventors: Krishnan S. Rengarajan, Bengaluru (IN); Alok Chandra, Bengaluru (IN); Chethan Ramanna, Mandya T&D (IN)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 16/216,369

(22) Filed: Dec. 11, 2018

(51) Int. Cl.
| | |
|---|---|
| *H03K 3/3562* | (2006.01) |
| *G01R 31/3185* | (2006.01) |
| *G01R 31/317* | (2006.01) |
| *H03K 3/012* | (2006.01) |

(52) U.S. Cl.
CPC ... *H03K 3/35625* (2013.01); *G01R 31/31721* (2013.01); *G01R 31/318541* (2013.01); *H03K 3/012* (2013.01)

(58) Field of Classification Search
CPC ............. H03K 3/012; H03K 3/356156; H03K 3/35625; G01R 31/31721; G01R 31/318541
See application file for complete search history.

(56) References Cited

U.S. PATENT DOCUMENTS

| | | | |
|---|---|---|---|
| 5,552,737 A | 9/1996 | Chen | |
| 6,348,825 B1 | 2/2002 | Galbi et al. | |
| 6,492,854 B1 | 12/2002 | Ku et al. | |
| 8,578,224 B2 * | 11/2013 | Gurumurthy | .. G01R 31/318552 714/726 |
| 8,880,965 B2 | 11/2014 | Zhang et al. | |
| 9,350,327 B2 * | 5/2016 | Nandi | ................... H03K 3/0372 |
| 9,755,623 B2 * | 9/2017 | Cheng | ................ H03K 3/35625 |
| 2006/0176095 A1 | 8/2006 | Chan et al. | |
| 2018/0159513 A1 | 6/2018 | Reddy et al. | |

OTHER PUBLICATIONS

Yuan et al., "New TSPC Latches and Flipflops Minimizing Delay and Power," IEEE, Symposium on VLSI Circuits, 1996, pp. 160-161.

(Continued)

*Primary Examiner* — Patrick O Neill

(57) ABSTRACT

Disclosed are scan flip-flops (SFFs) that reduce the dynamic power consumption of a system-on-chip (SOC) that incorporates them. Each SFF includes a master latch and a slave latch, each having a driver, a feed-forward path and a feedback path. Each SFF further includes at least one shared clock-gated power supply transistor, which is controlled by either a clock signal or an inverted clock signal to selectively and simultaneously connect a voltage rail to both the driver from one latch and the feedback path of the other latch. The different SFF embodiments have different numbers of shared clock-gated power supply transistors and various other different features designed for optimal power and/or performance. For example, the different SFF embodiments have different types of slave latch drivers; different types of transistors; and/or different types of master latch drivers (e.g., a single-stage, multiple clock phase-dependent driver or a multi-stage, single clock phase-dependent driver).

20 Claims, 8 Drawing Sheets

(56) References Cited

OTHER PUBLICATIONS

Singh et al., "A High Performance Flip Flop for Low Power Low Voltage Systems," IEEE, World Congress on Information and Communication Technologies, 2011, pp. 257-262.
Rubil Ahmadi, "A Power Efficient Hold-Friendly Flip-Flop," IEEE, 2008, pp. 81-84.
Velammal et al., "High Speed and Low Power ASIC Using Threshold Logic," International Journal of Advanced Research in Basic Engineering Sciences and Technology (IJARBEST), vol. 2, Issue 11, 2016, pp. 24-31.
Naeini et al., "The Design and Implementation of a Low-Power Gating Scan Element in 32/28 nm CMOS Technology," Journal of Low Power Electronics and Applications, 2017, pp. 1-20.
Sayed et al., "A New Low Power High Performance Flip-Flop," Midwest Symposium on Circuits and Systems, MWSCAS, 2006, pp. 1-5.
Strollo et al., "New Clock-Gating Techniques for Low-Power Flip-Flops," ACM, 2000, pp. 114-119.
Wimer et al., "Design Flow for Flip-Flop Grouping in Data-Driven Clock Gating," IEEE Transactions on Very Large Scale Integration (VLSI) Systems, vol. 22, No. 4, 2014, pp. 771-778.

\* cited by examiner

LOW-POWER SCAN FLIP-FLOP

BACKGROUND

Field of the Invention

The present invention relates to flip-flop structures and, particularly, to scan flip-flop (SFF) structures that are configured for reduced power consumption.

Description of Related Art

More specifically, one key goal for system-on-chip (SOC) structures is power optimization and, particularly, reducing total power consumption. Components of total power consumption include both dynamic power consumption and static power consumption (also referred to in the art as leakage power consumption). While various different techniques for reducing either dynamic power consumption or static power consumption are known, often times techniques that result in a reduction in dynamic power consumption will cause a corresponding increase in static power consumption or some other undesirable result (e.g., an increase area consumption or a decrease in performance).

For example, a SOC structure may include a large number of scan flip-flops (SFFs). Techniques for reducing dynamic power consumption associated with such SFFs include reducing the positive voltage (VDD) level supplied to the SFFs and/or reducing the load on the clock tree that drives the SFFs. Reducing the VDD level can result in SFF performance degradation including, for example, slower switching speeds. To limit this performance degradation, the threshold voltage (Vt) of transistors incorporated into each SFF can be decreased. Unfortunately, decreasing the transistor Vt generally results in a corresponding increase in leakage current (i.e., an increase in static power consumption). Furthermore, currently available techniques designed to reduce the load on the clock tree generally result in a corresponding decrease in performance, an increase in static power consumption, and/or an increase in SFF cell size. Clock switches 100% of the time compared to data signals in an SoC with 10s of 1000s of flip flops. Data paths typically have activity factors of 20% to 50%. Every clock switching node generated inside the flip flop or latch circuits for improving setup time or improving isolation from poor input clock slews to the flip flop, or other such reasons, can cause up to 3 times additional power to the whole flip flop. This full time activity on the clock is also motivation to keep the load on clock drivers inside the flip flops or latches at the minimum. Thus, there is a need in the art for SFF structures that allow for the reduction of the VDD level and/or reduction of the load on the clock tree of a SOC in order to reduce dynamic power consumption while limiting any corresponding decrease in performance, increase in static power consumption, and/or increase in cell size.

SUMMARY

In view of the foregoing, disclosed herein are embodiments of a scan flip-flop (SFF) configured to reduce the dynamic power consumption of a system-on-chip (SOC) that incorporates a large number of such SFFs. To achieve this reduction in the dynamic power consumption, the SFF embodiments reduce the load on the SOC clock tree by incorporating one or more shared clock-gated power supply transistors. Specifically, each SFF embodiment can include a master latch and a slave latch. These latches can be driven by a combination of a clock signal and an inverted clock signal and each latch can include a driver, a feed-forward path and a feedback path. Each SFF embodiment can also include at least one shared clock-gated power supply transistor, which is controlled by a given clock signal (e.g., either the clock signal or the inverted clock signal) in order to selectively and simultaneously connect a given voltage rail (e.g., a power voltage rail or a ground voltage rail) to both the driver from one latch and the feedback path of the other latch. The different SFF embodiments disclosed herein have different numbers of shared clock-gated power supply transistors and various other differences designed for optimal power and/or performance including, but not limited to, different types of slave latch drivers (e.g., a transmission gate driver or tristate logic driver), different types of transistors (e.g., a combination of super low threshold voltage (SLVT) and low threshold voltage (LVT) transistors or LVT transistors only), and/or different types of master latch drivers (e.g., a single-stage, multiple clock phase-dependent driver or a multi-stage, single clock phase-dependent driver).

More particularly, disclosed herein are various embodiments of a scan flip-flop (SFF). Each SFF can include a first latch (also referred to herein as a master latch), and a second latch (also referred to herein as a slave latch). The first latch can include a first driver with first driver input nodes and a first driver output node, a first feed-forward path, and a first feedback path. The second latch can be downstream of the first latch and can include a second driver with a second driver input node and a second driver output node, a second feed-forward path, and a second feedback path. Each SFF embodiment can further include a final output driver (referred to herein as a third driver) downstream of the second latch.

Within each SFF embodiment, the first feed-forward path of the first latch can connect the first driver output node to the second driver input node and the first feedback path can be connected to at least one first node on the first feed-forward path. Additionally, the second feed-forward path can connect the second driver output node to the third driver input node and the second feedback path can be connected to at least one second node on the second feed-forward path.

Each SFF embodiment can further include at least one shared clock-gated power supply transistor. Each shared clock-gated power supply transistor can include a gate that receives one of two clock signals in different phases and, particularly, either a clock signal or an inverted clock signal. Each shared clock-gated power supply transistor can also include a first source/drain terminal connected to a given voltage rail (i.e., a given one of either a positive voltage rail or a ground voltage rail), and a second source/drain terminal connected to one driver and to one feedback path for different ones of the first latch and the second latch. Thus, the power supply transistor is "clock-gated", meaning that it is controlled by a given clock signal (e.g., either the clock signal or the inverted clock signal), and "shared", meaning that, when enabled, it selectively and simultaneously connects a given voltage rail (e.g., a power voltage rail or a ground voltage rail) to both latches and, particularly, to the driver of the first latch and the feedback path of the second latch or vice versa.

It should be noted that a clock-gate power supply transistor can only be shared, as described above, if doing so will not impact the value of the stored signal in either latch given the SFF configuration. The different SFF embodiments disclosed herein have different configurations designed for optimal power and/or performance including, but not limited to, different types of master latch drivers (e.g., a single-stage, multiple clock phase-dependent driver or a multi-stage, single clock phase-dependent driver), different types of slave latch drivers (e.g., a transmission gate driver or tristate logic driver), and/or different types of transistors (e.g., a combination of super low threshold voltage (SLVT) and low threshold voltage (LVT) transistors or LVT transistors only). As a result of these different configurations, these different SFF embodiments also have different numbers of shared clock-gated power supply transistors.

For example, in one SFF embodiment disclosed herein, the first driver can be a single-stage, multiple clock phase-dependent driver. That is, the first driver can have only a multiplexor stage and can be driven by both a clock signal and an inverted clock signal. The second driver can be a tristate logic structure. This SFF embodiment can further include multiple and, particularly, four shared clock-gated power supply transistors including: a first p-type shared clock-gated power supply transistor, which connects the positive voltage rail to the first driver and to the second feedback path and which is controlled by the clock signal; a first n-type shared clock-gated power supply transistor, which connects the ground voltage rail to the first driver and to the second feedback path and which is controlled by an inverted clock signal; a second p-type shared clock-gated power supply transistor, which connects the positive voltage rail to the second driver and to the first feedback path and which is controlled by the inverted clock signal; and a second n-type shared clock-gated power supply transistor, which connects the ground voltage rail to the second driver and to the first feedback path and which is controlled by the clock signal. In this case, all the multiple shared clock-gated power supply transistors and all first driver transistors can have a lower threshold voltage than all other transistors of the first latch, the second latch and the third driver. For example, all the multiple shared clock-gated power supply transistors and all transistors within the first driver can be super low threshold voltage (SLVT) transistors, whereas all other transistors can be low threshold voltage (LVT) transistors.

In another SFF embodiment disclosed herein, the first driver can be a single-stage, multiple clock phase-dependent driver and the second driver can be a transmission gate. This SFF embodiment can further include at least one shared clock-gated power supply transistor with a first source/drain terminal connected to a voltage rail and a second source/drain terminal connected to the first driver of the first latch and the second feedback path of the second latch. For example, this SFF embodiment can include multiple and, particularly, two shared clock-gated power supply transistors including: a p-type shared clock-gated power supply transistor, which is controlled by the clock signal to selectively and simultaneously connect the positive voltage rail to both the first driver of the first latch and the second feedback path of the second latch; and an n-type shared clock-gated power supply transistor, which is controlled by the inverted clock signal to selectively and simultaneously connect the ground voltage rail to the first driver of the first latch and the second feedback path of the second latch. This SFF embodiment can also include multiple non-shared clock-gated power supply transistors and multiple additional clock-gated transistors. In this case, all clock-gated transistors, all first driver transistors and all second driver transistors have a lower threshold voltage than all other transistors of the first latch, the second latch and the third driver. For example, all the clock-gated transistors and all transistors within the first driver and the second driver can be super low threshold voltage (SLVT) transistors, whereas all other transistors can be low threshold voltage (LVT) transistors.

In yet another SFF embodiment disclosed herein, the first driver can be a multi-stage, single clock phase-dependent, driver. Specifically, the first driver can have two stages: a multiplexor stage with a multiplexor output node and a tristate output stage with the first driver output node. In this case, the first driver output signal at the first driver output node is dependent, in part, on a multiplexor output signal at the multiplexor output node. By making the output of the first driver data-dependent (i.e., dependent on the output signal of the multiplexor), this configuration eliminates the need to have the first driver be dependent on multiple clock phases, reducing the load on the SOC clock tree and, thereby reducing dynamic power consumption. Additionally, in this SFF embodiment, the second driver can be a tristate logic structure and only a single shared clock-gate power supply transistor can be employed. Specifically, the shared clock-gated power supply transistor can be an n-type transistor, which has a first source/drain terminal connected to a ground voltage rail and a second source/drain terminal connected to the second driver and to the first feedback path and which is controlled by the clock signal. Other features of this embodiment include multiple non-shared clock-gated power supply transistors as well as several additional clock-gated transistors. In this case, all the transistors in the SFF can be of the same type (e.g., all low threshold voltage (LVT) transistors).

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

Figure 1:
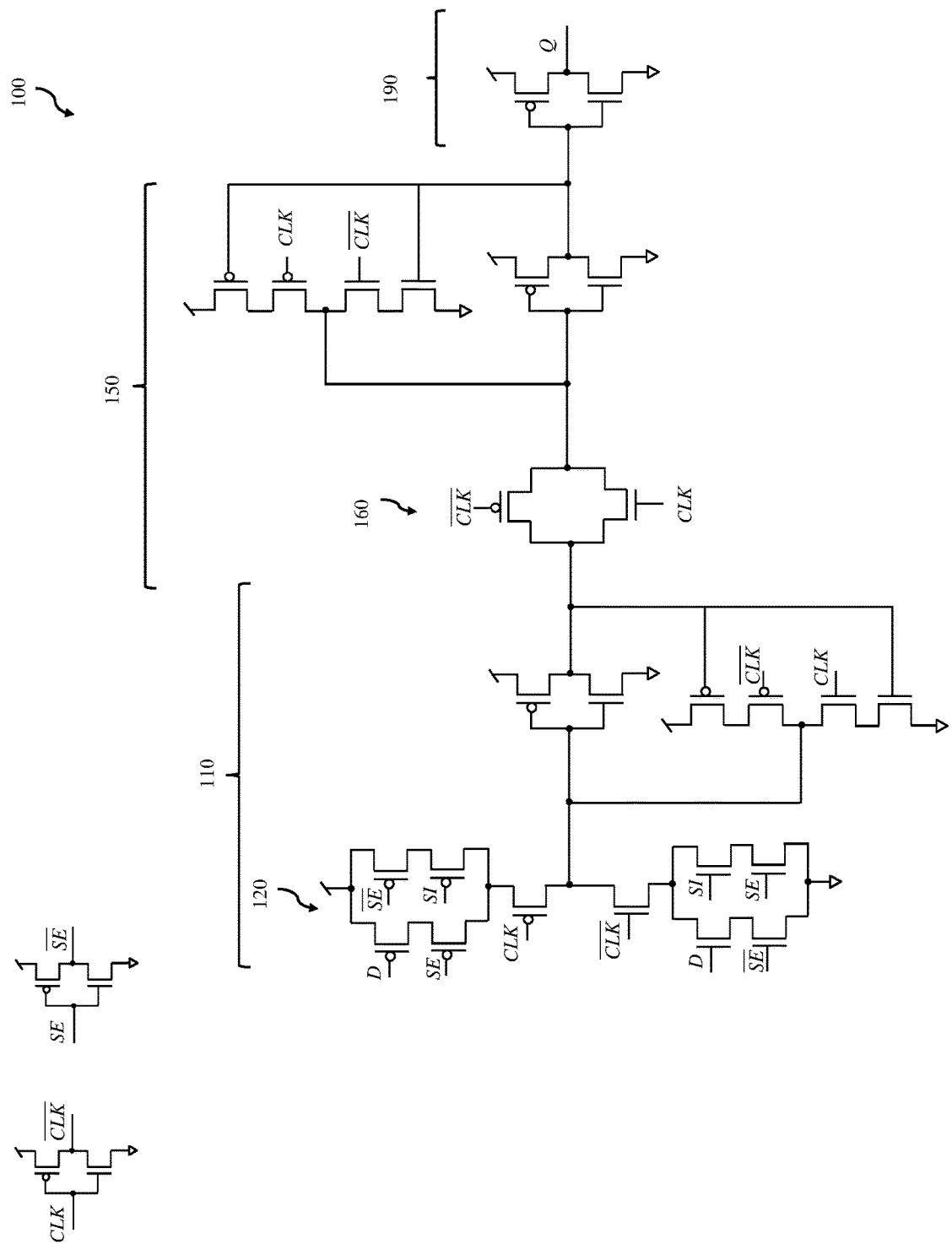
FIG. 1 is a schematic diagram illustrating an exemplary scan flip-flop (SFF)

As mentioned above, a system-on-chip (SOC) structure may include a large number of scan flip-flops (SFFs). FIG. 1 is a schematic diagram illustrating an exemplary scan flip-flop (SFF) 100. Those skilled in the art will recognize that a SFF is a design for test (DFT) structure that, like a D flip-flop, includes a master latch 110 (referred to herein as a first latch) and a slave latch 150 (referred to herein as a second latch) as well as an output driver 190. However, instead of processing a single data input as in a D flip-flop, the driver 120 of the first latch 110 is a multiplexor and a scan enable signal (SE) and optional inverted scan enable signal ($\overline{SE}$) are used to select between an operational data input (D) (e.g., during normal FF operation) or a scan-in data input (SI) (e.g., during a system test). When SE is low, D will be the data input propagated through the flip-flop; whereas when SE is high, SI will be the data input propagated through the flip-flop. In either case, operation of this SFF 100 is driven by a combination of clock signal (CLK) nodes and inverted clock signal ($\overline{CLK}$) nodes. Given the placement of these nodes within the SFF 100, as illustrated, when the CLK switches to low such that $\overline{CLK}$ is high, the driver 120 of the first latch 110 turns on and the driver 160 of the second latch 150 turns off. Thus, the state stored in the first latch 110 will change, if necessary, to reflect the current state of the selected data input but the state stored in the second latch 150 and the output (Q) of the output driver 190 will remain unchanged (i.e., essentially constant). When the clock signal (CLK) switches to high such that the inverted clock signal ($\overline{CLK}$) is low, the driver 120 of the first latch 110 turns off and the driver 160 of the second latch 150 turns on. Thus, the state stored in the first latch 110 will remain unchanged (i.e., essentially constant) regardless of whether or not the data input switches states. Additionally, the state stored in the second latch 150 and the output (Q) will change, as necessary, to reflect the current state of the data stored in the first latch 110. While such an SFF 100 may perform as desired. That is, the Q output will track the selected D or SI input. However, the relatively high number of CLK and $\overline{CLK}$ nodes, each of which requires a separate input clock pin, corresponds to a relatively high load on the clock tree of the SOC and, thereby a relatively high dynamic power consumption.

Techniques for reducing high SOC dynamic power consumption caused by SFFs, such as that shown in FIG. 1, include reducing the positive voltage (VDD) level supplied to the SFFs and/or reducing the load on the clock tree that drives the SFFs. Reducing the VDD level can result in SFF performance degradation including, for example, slower switching speeds. To limit this performance degradation, the threshold voltage (Vt) of transistors incorporated into each SFF can be decreased. Unfortunately, decreasing the transistor Vt generally results in a corresponding increase in leakage current (i.e., an increase in static power consumption). Furthermore, currently available techniques designed to reduce the load on the clock tree generally result in a corresponding decrease in performance, an increase in static power consumption, and/or an increase in SFF cell size. Thus, there is a need in the art for SFF structures that allow for the reduction of the VDD level and/or reduction of the load on the clock tree of a SOC in order to reduce dynamic power consumption while limiting in any corresponding decrease in performance, increase in static power consumption, and/or increase in cell size.

In view of the foregoing, disclosed herein are embodiments of a scan flip-flop (SFF) configured to reduce the dynamic power consumption of a system-on-chip (SOC) that incorporates a large number of such SFFs. To achieve this reduction in the dynamic power consumption, the SFF embodiments reduce the load on the SOC clock tree by incorporating one or more shared clock-gated power supply transistors. Specifically, each SFF embodiment can include a master latch and a slave latch. These latches can be driven by a combination of a clock signal and an inverted clock signal and each latch can include a driver, a feed-forward path and a feedback path. Each SFF embodiment can also include at least one shared clock-gated power supply transistor, which is controlled by a given clock signal (e.g., either the clock signal or the inverted clock signal) in order to selectively and simultaneously connect a given voltage rail (e.g., a power voltage rail or a ground voltage rail) to both the driver from one latch and the feedback path of the other latch. The different SFF embodiments disclosed herein have different numbers of shared clock-gated power supply transistors and various other differences designed for optimal power and/or performance including, but not limited to, different types of slave latch drivers (e.g., a transmission gate driver or tristate logic driver), different types of transistors (e.g., a combination of super low threshold voltage (SLVT) and low threshold voltage (LVT) transistors or LVT transistors only), and/or different types of master latch drivers (e.g., a single-stage, multiple clock phase-dependent driver or a multi-stage, single clock phase-dependent driver).

Figure 2:
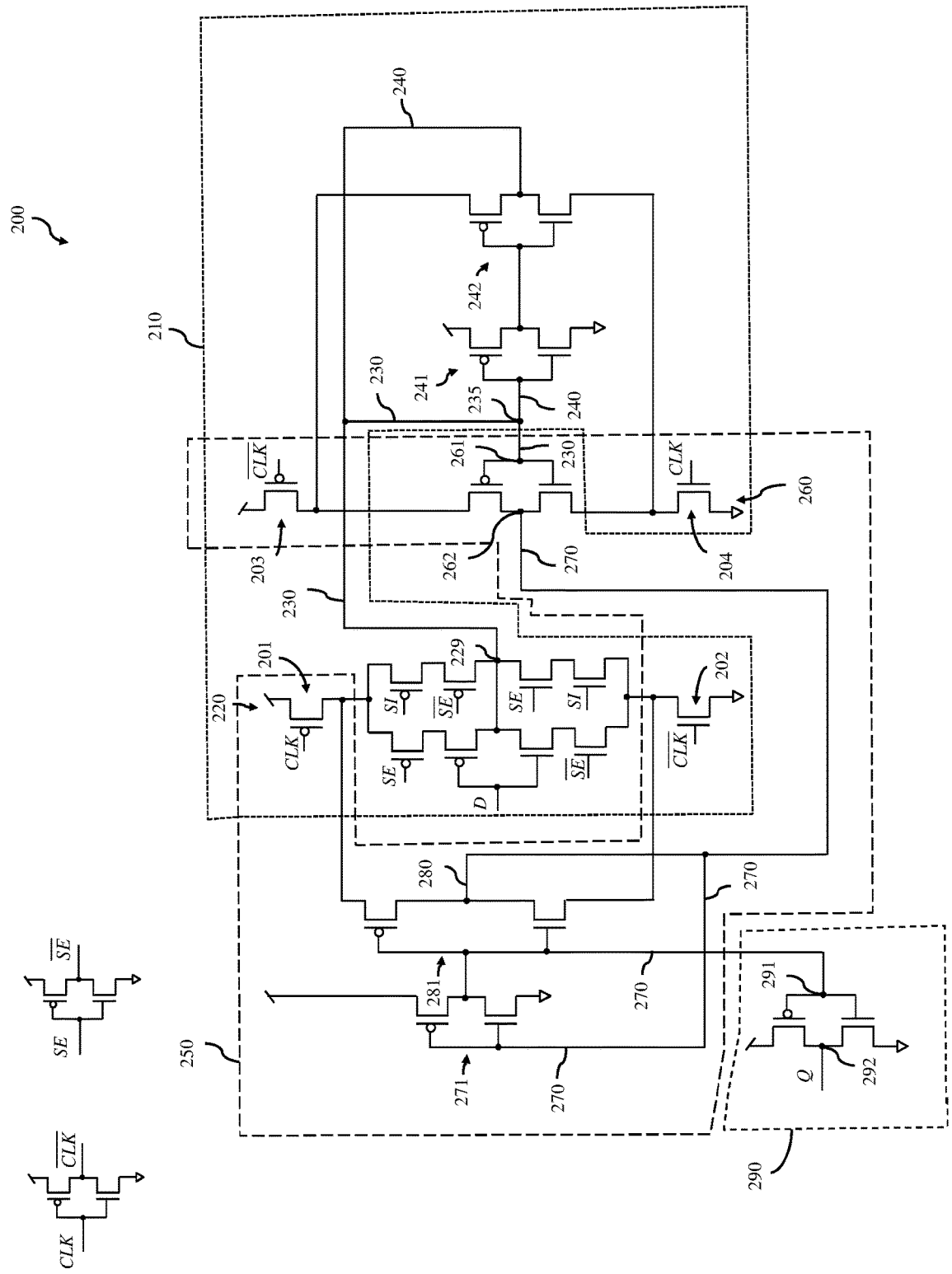
FIG. 2 is a schematic diagram illustrating an embodiment of a low-power SFF.
Figure 3:
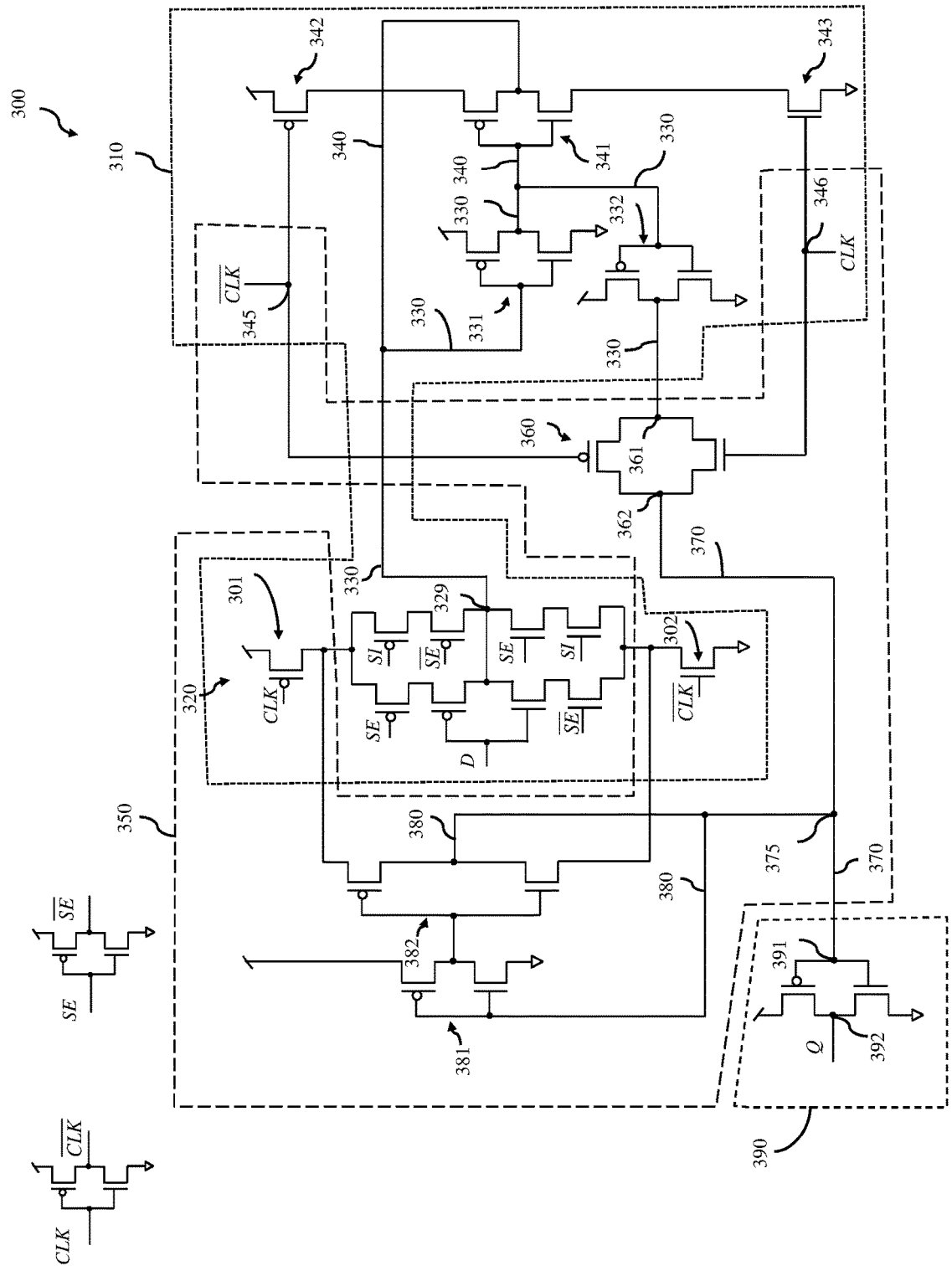
FIG. 3 is a schematic diagram illustrating another embodiment of a low-power SFF.
Figure 4:
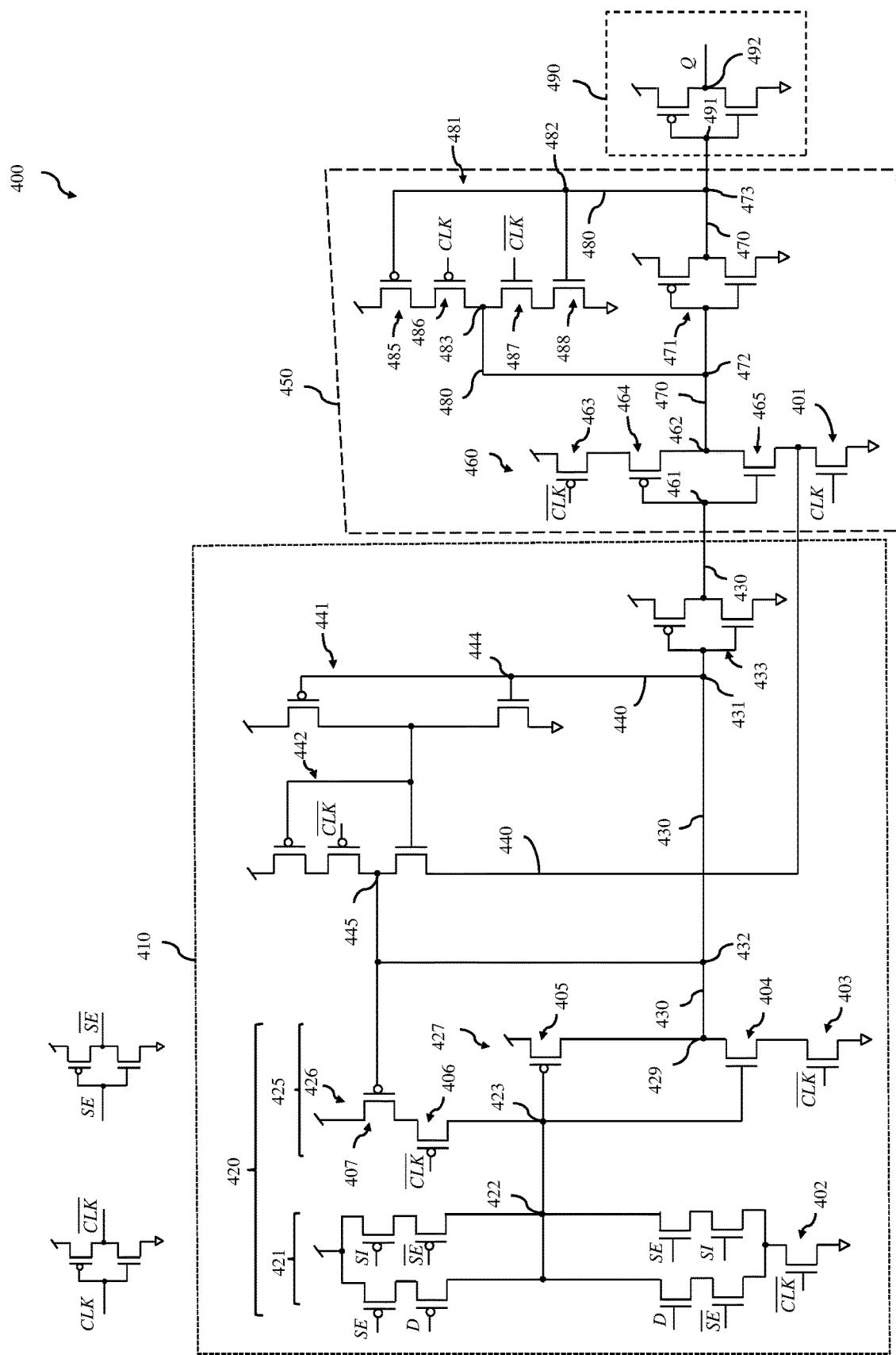
FIG. 4 is a schematic diagram illustrating yet another embodiment of a low-power SFF.

More particularly, as illustrated in FIGS. 2, 3 and 4 disclosed herein are multiple embodiments of a scan flipflop (SFF) 200, 300 and 400, respectively, configured to reduce the dynamic power consumption of a system-on-chip (SOC) that incorporates a large number of such SFFs.

Each SFF 200, 300, 400 can include a first latch 210, 310, 410 (also referred to herein as a master latch). The first latch 210, 310, 410 can include a first driver 220, 320, 420. As discussed in greater detail below with regard to the specific embodiments, the first driver 220, 320, 420 can at least perform a clocked multiplexing function based on a combination of input signals at multiple first driver input nodes. Specifically, given the voltage levels of a scan-enable signal (SE) and optional inverted scan enable signal ($\overline{SE}$), the first driver 220, 320, 420 can selectively propagate an operational data input (D) (e.g., during normal FF operation) or a scan-in data input (SI) (e.g., during a system test) to a first driver output node 229, 329, 429. The first latch 210, 310, 410 can further include a first feed-forward path 230, 330, 430 and a first feedback path 240, 340, 440.

Each SFF 200, 300, 400 can also include a second latch 250, 350, 450 (also referred to herein as a slave latch), which is downstream of the first latch 210, 310, 410. The second latch 250, 350, 450 can include a second driver 260, 360, 460 with a second driver input node 261, 361, 461 and a second driver output node 262, 362, 462. The second driver 260, 360, 460 can also include a second feed-forward path 270, 370, 470 and a second feedback path 280, 380, 480.

Each SFF can further include a third driver 290, 390, 490 (also referred to herein as a final output driver) downstream of the second latch 250, 350, 450. The third driver 290, 390, 490 can be an inverter and can have a third driver input node 291, 391, 491 and a third driver output node 292, 392, 492 (also referred to herein as a final output node).

Within each SFF 200, 300, 400, the first feed-forward path 230, 330, 430 of the first latch 210, 310, 410 can connect the first driver output node 229, 329, 429 to the second driver input node 261, 361, 461 and the first feedback path 240, 340, 440 can be connected to at least one first node on the first feed-forward path 230, 330, 430. That is, the first feedback path can form a loop with opposite ends either connected to two different nodes on the first feed-forward path or connected to the same node on the first feed-forward path. Additionally, the second feed-forward path 270, 370, 470 can connect the second driver output node 262, 362, 462 to the third driver input node 291, 391, 491 and the second feedback path 280, 380, 480 can be connected to at least one second node on the second feed-forward path 270, 370, 470. That is, the second feedback path can form a loop with opposite ends either connected to two different nodes on the second feed-forward path or connected to the same node on the second feed-forward path.

Each SFF 200, 300, 400 is driven by a combination of two phases of the same clock signal: clock signal (CLK) and inverted clock signal ($\overline{CLK}$), which is 180° offset from CLK.

Each SFF 200, 300, 400 can further include at least one shared clock-gated power supply transistor (e.g., see shared clock-gate power supply transistors 201-204 of FIG. 2, 301-302 of FIG. 3, and 401 of FIG. 4). For purposes of this disclosure, a "clock-gated power supply transistor" refers to a field effect transistor (FET), which is controlled by a given one of two different phases of the clock signal (i.e., CLK or $\overline{CLK}$) such that it is considered "clock-gated" and which functions as a switch that selectively enables and disables an electrical connection between the SFF and a given supply voltage rail (i.e., positive supply voltage (VDD) rail or ground voltage (VSS) rail) depending upon the current state of the clock signal and the conductivity type of the FET such that it is considered a power supply transistor. Those skilled in the art will recognize the connection to the VDD rail will be provided by a PFET, which is turned on when the signal is low and turned off when the signal is high, and the connection to the VSS rail will be provided by an NFET, which is turned on when the signal is high and turned off when the signal is low. Furthermore, for purposes of this disclosure, a "shared" clock-gated power supply transistor refers to a single transistor that provides this connection simultaneously to both the first latch (i.e., the master latch) and the second latch (i.e., the slave latch) of the SFF such that it is considered shared by the first and second latches.

Specifically, each shared clock-gated power supply transistor (e.g., 201-204 of FIG. 2, 301-302 of FIG. 3, and 401 of FIG. 4) can include a gate that receives a given one of CLK or $\overline{CLK}$. Each shared clock-gated power supply transistor (e.g., 201-204 of FIG. 2, 301-302 of FIG. 3, and 401 of FIG. 4) can also include a first source/drain terminal connected to a given voltage rail (i.e., the VDD rail or the VSS rail) and a second source/drain terminal connected to one driver and to one feedback path for different ones of the first latch 210, 310, 410 and the second latch 250, 350, 450 such that it is considered to be "shared" by both latches and particularly, by the driver of the first latch and the feedback path of the second latch or vice versa. By employing such shared clock-gated power supply transistor(s), the disclosed SFFs reduce the number of input clock pins required to drive the SFF as compared to prior art SFFs, thereby reducing the load on the clock tree and the dynamic power consumption of SOC.

It should be noted that a clock-gate power supply transistor can only be shared, as described above, if doing so will not corrupt the value of the stored signal in either latch given the SFF configuration. Such corruption could happen through interaction of switching activity in the circuits across which the sharing is done or can happen due to circuit loops that can wrongly connect the data of the two circuits across which the sharing is done. Such interaction or loops could occur in any of the clock states or during clock transitions. Thus the sharing of the clock transistor needs to be done with careful consideration of above-mentioned problems.

The different SFF embodiments disclosed herein have different configurations designed for optimal power and/or performance including, but not limited to, different types of master latch drivers (e.g., a single-stage, multiple clock phase-dependent driver or a multi-stage, single clock phase-dependent driver), different types of slave latch drivers (e.g., a transmission gate driver or tristate logic driver), and/or different types of transistors (e.g., a combination of super low threshold voltage (SLVT) and low threshold voltage (LVT) transistors or LVT transistors only). As a result of these different configurations, the different SFF embodiments disclosed herein also have different numbers of shared clock-gated power supply transistors.

For example, the SFF 200 of FIG. 2 can include: a first latch 210 (including: a first driver 220 with first driver input nodes and a first driver output node 229; a first feed-forward path 230; and a first feedback path 240); a second latch 250 (including: a second driver 260 with a second driver input node 261 and a second driver output node 262; a second feed-forward path 270; and a second feedback path 280); and a third driver 290 (including: a third driver input node 291 and a third driver output node 292).

This SFF 200 can also include multiple and, particularly, four shared clock-gated power supply transistors 201-204. Specifically, a first p-type shared clock-gated power supply transistor 201 can be controlled by CLK to selectively and simultaneously connect the VDD rail to (or disconnect the VDD rail from) the first driver 220 of the first latch 210 and the second feedback path 280 of the second latch 250. A first n-type shared clock-gated power supply transistor 202 can be controlled by $\overline{CLK}$ to selectively and simultaneously connect the VSS rail to (or disconnect the VSS rail from) the first driver 220 of the first latch 210 and the second feedback path 280 of the second latch 250. A second p-type shared clock-gated power supply transistor 203 can be controlled by $\overline{CLK}$ to selectively and simultaneously connect the VDD rail to (or disconnect the VDD rail from) the second driver 260 of the second latch 250 and the first feedback path 240 of the first latch 210. Finally, a second n-type shared clock-gated power supply transistor 204 can be controlled by CLK to selectively and simultaneously connect the VSS rail to (or disconnect the VSS rail from) the second driver 260 of the second latch 250 and the first feedback path 240 of the first latch 210.

In this SFF 200, the first driver 220 of the first latch 210 can be a single-stage, multiple clock phase-dependent driver. That is, the first driver 220 can be a multiplexor (i.e., can have only a multiplexor stage) and operation of the multiplexor can be dependent upon both CLK and $\overline{CLK}$. The first driver 220 (i.e., the multiplexor) can include a first set of series-connected transistors (including two PFETs and two NFETs) and a second set of series connected transistors (also including two PFETs and two NFETs), which are connected in parallel between the first p-type shared clock-gated power supply transistor 201 and the first n-type shared clock-gated power supply transistor 202. Additionally, the multiplexor can have an intermediate node at the junction between the two PFETs and the two NFETs in the first set electrically connected to a first driver output node 229 at the junction between the two PFETs and the two NFETs in the second set. The multiplexor can further include first driver input nodes, which receive first driver input signals, on the gates of the two PFETs and two NFETs in each set. As illustrated, the first driver input signals can include a data signal (D) applied to one PFET and one NFET of the first set, a scan enable signal (SE) applied to one PFET in the first set and one NFET in the second set, an inverted scan enable signal ($\overline{SE}$) applied to one NFET in the first set and one PFET in the second set, and a scan-in signal (SI) applied to one PFET and one NFET in the second set. When SE is low and, thus $\overline{SE}$ is high, D will be the data input propagated to the first driver output node 229 when the first latch 210 is on (i.e., when CLK is low and $\overline{CLK}$ is high); whereas when SE is high and, thus $\overline{SE}$ is low, SI will be the data input propagated to the first driver output node 229 when the first latch 210 is on (i.e., when CLK is low and $\overline{\text{CLK}}$ is high).

The first feed-forward path 230 can be a direct path (i.e., without devices) that connects the first driver output node 229 to the second driver input node 261 of the second driver 260 of the second latch 250. The first feedback path 240 can include an inverter 241 and a tristate logic structure 242 connected in series with input and output nodes electrically connected in a loop to a first node 235 of the first feed-forward path 230 at one end connected to the second driver input node 261. As illustrated, the tristate logic structure 242 of the first feedback path 240 of the first latch can include the second p-type shared clock-gated power supply transistor 203 and the second n-type shared clock-gated power supply transistor 204.

In this SFF 200, the second driver 260 can be an additional tristate logic structure. As illustrated, the tristate logic structure of the second driver 260 can include four stacked transistors including two PFETs and two NFETs. One of these two PFETs can be a PFET controlled by the voltage level at the second driver input node 261 and the other can be the second p-type shared clock-gated power supply transistor 203. Similarly, one of the two NFETs can be an NFET controlled by the voltage level at the second driver input node 261 and the other can be the second n-type shared clock-gated power supply transistor 204. That is, the clock-gated power supply transistors 203 and 204 are components of both the tristate logic structure 242 of the first feedback path 240 of the first latch 210 and the additional tristate logic structure of the second driver 260 of the second latch 250.

The second feed-forward path 270 can include an inverter 271 connected in series between the second driver 260 and the third driver 290. The second feedback path 280 can include yet another tristate logic structure 281 with input and output nodes connected to output and input nodes, respectively, of the inverter 271. Additionally, as illustrated, this tristate logic structure 281 can include four stacked transistors including two PFETs and two NFETs. One of the two PFETs can be a PFET controlled by the voltage level at the output of the inverter 271 and the other can be the first p-type shared clock-gated power supply transistor 201. Similarly, one of the two NFETs can be an NFET controlled by the voltage level at the output of the inverter 271 and the other can be the first n-type shared clock-gated power supply transistor 202. Thus, the clock-gated power supply transistors 201 and 202 are shared by the first driver 220 of the first latch 210 and the tristate logic structure 281 of the second feedback path 280 in the second latch 250.

The third driver 290 can include an inverter with, as mentioned above, a third driver input node 291 and a third driver output node 292 (i.e., a final output node). The third driver input node 291 can be connected to the second feed-forward path 270 at the junction between the second feed-forward path 270 and the second feedback path 280 (i.e., at the junction between the inverter 271 and the tristate logic structure 281).

With this configuration, all the multiple shared clock-gated power supply transistors 201-204 and all first driver 220 transistors (i.e., all transistors within the multiplexor) can have a lower threshold voltage than all other transistors of the first latch 210, the second latch 250 and the third driver 290. For example, instead of all the transistors within the SFF 200 being low threshold voltage (LVT) transistors, all the multiple shared clock-gated power supply transistors and all transistors within the first driver can be super low threshold voltage (SLVT) transistors, whereas all other transistors can be low threshold voltage (LVT) transistors.

In operation, when CLK switches to low and $\overline{\text{CLK}}$ switches to high, the first driver 220 of the first latch 210 and the tristate logic structure 281 of the second feedback path 280 of the second latch 250 both turn on. Additionally, the second driver 260 of the second latch 250 and the tristate logic structure 242 of the first feedback path 240 of the first latch 210 both turn off. When the first driver 220 (i.e., the multiplexor) is on and the selected data value (D or SI) is high, a pull-down stage of the multiplexor will take over such that the voltage level on the first driver output node 229 will be pulled down (i.e., the state of the first driver output signal at the first driver output node 229 will be low). In this case, the voltage level at the second driver input node 261 will be low and the tristate logic structure 242 of the first feedback path 240 will have a high impedance output state. When the first driver 220 (i.e., the multiplexor) is on and the selected data value (D or SI) is low, then a pull-up stage of the multiplexor will take over such that the voltage level on the first driver output node 229 will be pulled up (i.e., the first driver output signal will be high). As a result, the voltage level at the second driver input node 261 will be high and, again, the tristate logic structure 242 of the first feedback path 240 will have a high impedance output state. Regardless of whether the voltage level at the second driver input node 261 is high or low, given that the tristate logic structure of the second driver 260 is turned off (i.e., that the second driver 260 has a high impedance state) and the tristate logic structure 281 of the second feedback path 280 is turned on, the voltage level (i.e., the state) at the third driver input node 291 of the third driver 290 will be maintained. Thus, the voltage level of the final output signal (Q) at the third driver output node 292 of the third driver 290, which corresponds to the state of the previously latched data input, will remain stable (i.e., Q will remain unchanged).

However, when CLK switches to high and $\overline{\text{CLK}}$ switches to low, the first driver 220 of the first latch 210 and the tristate logic structure 281 of the second feedback path 280 turn off and the second driver 260 of the second latch 250 and the tristate logic structure 242 of the first feedback path 240 turn on. Thus, the first feedback path 240 will maintain the current voltage level (i.e., the current state) on the second driver input node 261 (i.e., changes in the voltage level of the selected data input (D or SI) will not cause a corresponding voltage level changes at the second driver input node 261). If the selected data value (D or SI) was high such that the voltage level at the second driver input node 261 was low when the second driver turned on, then the voltage level at the second driver output node 262 will be pulled up. In this case, the input to the inverter 271 in the second feed-forward path 270 will be high and the output from that inverter 271 will be low. As a result, the input to the third driver 290 (which is also an inverter) will be low and the final output signal (Q) will be high. That is, Q will reflect D. If, however, the selected data value (D or SI) was low such that the voltage level at the second driver input node 261 was high when the second driver 260 turned on, the voltage level at the second driver output node 262 will be pulled down. In this case, the input to the inverter 271 in the second feed-forward path 270 will be low and the output of that inverter 271 will be high. As a result, the input to the third driver 290 (which is also an inverter) will be high and the final output signal (Q) will be low. That is, Q will reflect D. Regardless of whether the output of the inverter 271 is high or low, since the tristate logic structure 281 in the second feedback path 280 is off it will have a high impedance output state.

By employing the shared clock-gated power supply transistors 201-204, a reduced number of input clock pins are required to drive the SFF as compared to prior art SFFs, thereby reducing the load on the clock tree and the dynamic power consumption of SOC. Furthermore, by reducing the threshold voltage of at least some of the transistors, dynamic power consumption is further reduced. It should be noted that, while the SLVT transistors may be leaker (i.e., may increase leakage power consumption), this leakage can be limited by using the proposed combination of SLVTs and LVTs (e.g., by stacking three transistors, leakage current can be lowered by as much as 4-5 times).

The SFF 300 of FIG. 3 can include: a first latch 310 (including: a first driver 320 with first driver input nodes and a first driver output node 329; a first feed-forward path 330; and a first feedback path 340); a second latch 350 (including: a second driver 360 with a second driver input node 361 and a second driver output node 362; a second feed-forward path 370; and a second feedback path 380); and a third driver 390 (including: a third driver input node 391 and a third driver output node 392).

This SFF 300 can also include multiple and, particularly, two shared clock-gated power supply transistors 301-302. Specifically, a p-type shared clock-gated power supply transistor 301 can be controlled by CLK to selectively and simultaneously connect the VDD rail to (or disconnect the VDD rail from) the first driver 320 of the first latch 310 and the second feedback path 380 of the second latch 350. An n-type shared clock-gated power supply transistor 302 can be controlled by $\overline{CLK}$ to selectively and simultaneously connect the VSS rail to (or disconnect the VSS rail from) the first driver 320 of the first latch 310 and the second feedback path 380 of the second latch 350. In addition to these shared clock-gated power supply transistors 301-302, it should be noted that the SFF 300 includes other clock-gated transistors. For example, the SFF 300 includes two non-shared clock-gated power supply transistors 341-342 that are included in a tristate logic structure 341 in the first feedback path 340 and multiple additional clock-gated transistors of a transmission gate that forms the second driver 360 (see a more detailed discussion of these first feedback path 340 and second driver 360 below).

In this SFF 300, the first driver 320 of the first latch 310 can be a single-stage, multiple clock phase-dependent driver. That is, the first driver 320 can be a multiplexor (i.e., can have only a multiplexor stage) and operation of the multiplexor can be dependent upon both CLK and $\overline{CLK}$. The first driver 320 (i.e., the multiplexor) can include a first set of series-connected transistors (including two PFETs and two NFETs) and a second set of series connected transistors (also including two PFETs and two NFETs), which are connected in parallel between the p-type shared clock-gated power supply transistor 301 and the n-type shared clock-gated power supply transistor 302. Additionally, the multiplexor can have an intermediate node at the junction between the two PFETs and the two NFETs in the first set electrically connected to a first driver output node 329 at the junction between the two PFETs and the two NFETs in the second set. The multiplexor can further include first driver input nodes, which receive first driver input signals, on the gates of the two PFETs and two NFETs in each set. As illustrated, the first driver input signals can include a data signal (D) applied to one PFET and one NFET of the first set, a scan enable signal (SE) applied to one PFET in the first set and one NFET in the second set, an inverted scan enable signal ($\overline{SE}$) applied to one NFET in the first set and one PFET in the second set, and a scan-in signal (SI) applied to one PFET and one NFET in the second set. When SE is low and, thus $\overline{SE}$ is high, D will be the data input propagated to the first driver output node 329 when the first latch 310 is on (i.e., when CLK is low and $\overline{CLK}$ is high); whereas when SE is high and, thus $\overline{SE}$ is low, SI will be the data input propagated to the first driver output node 329 when the first latch 310 is on (i.e., when CLK is low and $\overline{CLK}$ is high).

The first feed-forward path 330 can connect the first driver output node 329 to a second driver input node 361 of the second driver 360 of the second latch 350. Specifically, the first feed-forward path 330 can include a pair of inverters (i.e., a first inverter 331 and a second inverter 332) connected in series between the first driver 320 and the second driver 360. The first feedback path 340 can include a tristate logic structure 341 with input and output nodes connected to output and input nodes, respectively, of the first inverter 331. That is, the input to the tristate logic structure 341 is connected the first feed-forward path 330 at the junction between series connected inverters 331-332 and the output of the tristate logic structure 341 is connected to the first feed-forward path at the input to the first inverter 331. Thus, the second inverter 332 is downstream of the first feedback path 340. As illustrated, this tristate logic structure 341 of the first feedback path 340 can include four stacked transistors including two PFETs and two NFETs. One of the two PFETs can be a PFET controlled by the voltage level at the output of the inverter 331 and the other can be a p-type clock-gated power supply transistor 342, which is controlled by $\overline{CLK}$ and which is connected to the VDD rail. Similarly, one of the two NFETs can be an NFET controlled by the voltage level at the output of the inverter 331 and the other can be an n-type power supply transistor 343, which is controlled by CLK and which is connected to the VSS rail.

The second driver 360 of the second latch 350 can be a transmission gate. This transmission gate can include a p-type clock-gated transistor, which is controlled by $\overline{CLK}$, and n-type clock-gated transistor, which is controlled by CLK. As illustrated, first source/drain regions of these two transmission gate transistors can be connected at the second driver input node 361 and second source/drain regions of these two transmission gate transistors can be connected at the second driver output node 362. Additionally, as illustrated, the p-type clock-gated power supply transistor 342 of the tristate logic structure 341 of the first feedback path 340 and the p-type clock-gated transistor of the transmission gate (i.e., of the second driver 360) can be controlled by the same $\overline{CLK}$ on a shared inverted clock signal node 345. Furthermore, the n-type clock-gated transistor of the transmission gate (i.e., of the second driver 360) can be controlled by the same CLK on a shared clock signal node 346.

In this case, the second feed-forward path 370 can be a direct path (i.e., without device(s)) that connects the second driver 360 to the third driver 390. The second feedback path 380 can include an inverter 381 and a tristate logic structure 382 connected in series with input and output nodes connected in a loop to a second node 375 of the second feed-forward path at one end connected to the third driver input node 391. As illustrated, the tristate logic structure 382 of the second feedback path 380 can include four stacked transistors including two PFETs and two NFETs. One of the two PFETs can be a PFET controlled by the voltage level at the output of the inverter 381 and the other PFET can be the p-type shared clock-gated power supply transistor 301. Similarly, one of the two NFETs can also be controlled by the voltage level at the output of the inverter 381 and the other NFET can be the n-type shared clock-gated power supply transistor 302. Thus, the clock-gated power supply transistors 301 and 302 are components of both the first driver 320 of the first latch 310 and the tristate logic structure 382 of the second feedback path 380 of the second latch 350.

The third driver 390 can be an inverter with, as mentioned above, a third driver input node 391 and a third driver output node 392 (i.e., a final output node), which outputs the final output signal (Q).

With this configuration, all clock-gated transistors (including the shared clock-gated power supply transistors 301-302, the non-shared clock-gated power supply transistors 342-343 of the tristate logic structure 341 in the first feedback path 240, and the clock-gated transistors of the transmission gate of the second driver 360) and all first driver transistors (i.e., all transistors within the multiplexor of the first driver 320) can have lower threshold voltage than all other transistors of the first latch 310, the second latch 350 and the third driver 390. For example, instead of all the transistors within the SFF 300 being low threshold voltage (LVT) transistors, all clock-gated transistors (including the shared clock-gated power supply transistors 301-302, the non-shared clock-gated power supply transistors 342-343 of the tristate logic structure 341 in the first feedback path 340, and the clock-gated transistors of the transmission gate of the second driver 360) and all first driver transistors (i.e., all transistors within the multiplexor of the first driver 320) can be super low threshold voltage (SLVT) transistors, whereas all other transistors can be low threshold voltage (LVT) transistors.

In operation, when CLK switches to low and $\overline{CLK}$ switches to high, the first driver 320 of the first latch 310 and the tristate logic structure 382 in the second feedback path 380 turn on and the second driver 360 of the second latch 350 and the tristate logic structure 341 in the first feedback path 340 turn off. When the first driver 320 (i.e., the multiplexor) is on and the selected data value (D or SI) is high, a pull-down stage of the multiplexor will take over such that the voltage level on the first driver output node 329 will be pulled down (i.e., low). Since the first feed-forward path 330 includes the pair of series-connected inverters 331-332, the voltage level on the second driver input node 361 will be also be low. When the first driver 320 is on and the selected data value (D or SI) is low, then a pull-up stage of the multiplexor will take over such that the voltage level on the first driver output node 329 will be pulled up (i.e., high). In this case, since the first feed-forward path 330 includes the pair of series-connected inverters 331-332, the voltage level on the second driver input node 361 will be also be high. Regardless of whether the voltage level at the second driver input node 361 is low or high, given that the transmission gate of the second driver 360 is turned off (i.e., that the second driver 360 has a high impedance output state) and the inverter 318 and tristate logic structure 382 of the second feedback path 380 are on, the voltage level (i.e., the state) at the third driver input node 391 will be maintained. Thus, the voltage level of the final output signal (Q) at the third driver output node 392 of the third driver 390, which corresponds to the state of the previously latched data input, will remain stable (i.e., Q will remain unchanged).

However, when CLK switches to high and $\overline{CLK}$ switches to low, the first driver 320 of the first latch 310 and the tristate logic structure 382 of the second feedback path 380 turn off and the second driver 360 of the second latch 350 and the tristate logic structure 341 of the first feedback path 340 turn on. Thus, the first feedback path 340 will maintain the current voltage level (i.e., the current state) on the second driver input node 361 (i.e., changes in the voltage level of the selected data input (D or SI) will not cause corresponding voltage level changes at the second driver input node 361). If the selected data value (D or SI) was high such that, when the second driver 360 turned on, the voltage levels at the input to the inverter 331, at the output of the inverter 332 and at the second driver input node 361 were low, then the voltage level at the second driver output node 362 (i.e., the transmission gate output node) will also be low. In this case, the input to the third driver input node 391 will be low and the final output signal (Q) will be high (i.e., Q will reflect D). If, however, the selected data value (D or SI) was low such that, when the second driver 360 turned on, the voltage levels at the input to the inverter 331, at the output of the inverter 332 and at the second driver input node 361 were high, then the voltage level at the second driver output node 362 (i.e., the transmission gate output node) will also be high. In this case, the input to the third driver input node 391 will be high and the final output signal (Q) will be low (i.e., Q will reflect D). Regardless of whether the output of the inverter 381 of the second feedback path 380 is high or low, since the tristate logic structure 382 in the second feedback path 380 is off it will have a high impedance output state.

By employing the shared clock-gated power supply transistors 301-302, a reduced number of input clock pins are required to drive the SFF 300 as compared to prior art SFFs, thereby reducing the load on the clock tree and the dynamic power consumption of SOC. Furthermore, by reducing the threshold voltage of at least some of the transistors, dynamic power consumption is further reduced. Again, it should be noted that, while the SLVT transistors may be leaker (i.e., may increase leakage power consumption), this leakage can be limited by using the proposed combination of SLVTs and LVTs.

The SFF 400 can include: a first latch 410 (including: a first driver 420 with first driver input nodes and a first driver output node 429; a first feed-forward path 430; and a first feedback path 440); a second latch 450 (including: a second driver 460 with a second driver input node 461 and a second driver output node 462; a second feed-forward path 470; and a second feedback path 480); and a third driver 490 (including: a third driver input node 491 and a third driver output node 492).

This SFF 400 can also include a shared clock-gated power supply transistors 401. Specifically, an-type shared clock-gated power supply transistor 301 can be controlled by CLK to selectively and simultaneously connect the VSS rail to (or disconnect the VSS rail from) the second driver 460 of the second latch 450 and the first feedback path 440 of the first latch 410.

In this SFF 400, the first driver 420 of the first latch 410 can be a multi-stage, single clock phase-dependent driver. Specifically, the first driver 420 can have two stages: a multiplexor stage 421 and a tristate output stage 425.

The multiplexor stage 421 can include a first set of series-connected transistors (including two PFETs and two NFETs) and a second set of series connected transistors (also including two PFETs and two NFETs), which are connected in parallel between the VDD rail and an n-type clock-gated power supply transistor 402, which is controlled by CLK and connected to the VSS rail. Additionally, the multiplexor stage 421 can have an intermediate node at the junction between the two PFETs and the two NFETs in the first set electrically connected to a multiplexor output node 422 at the junction between the two PFETs and the two NFETs in the second set. The multiplexor stage 421 can further include first driver input nodes, which receive first driver input signals, on the gates of the two PFETs and two NFETs in each set. As illustrated, the first driver input signals can include a data signal (D) applied to one PFET and one NFET of the first set, a scan enable signal (SE) applied to one PFET in the first set and one NFET in the second set, an inverted scan enable signal ($\overline{SE}$) applied to one NFET in the first set and one PFET in the second set, and a scan-in signal (SI) applied to one PFET and one NFET in the second set. When SE is low and, thus $\overline{SE}$ is high, D will be the data input propagated to the multiplexor output node 422 when the first latch 410 is on (i.e., when $\overline{CLK}$ is high); whereas when SE is high and, thus SE is low, SI will be the data input propagated to the multiplexor output node 422 when the first latch 410 is on (i.e., when $\overline{CLK}$ is high).

The tristate output stage 425 can include a first branch 426, a second branch 427 and a connecting node 423 between the first branch 426 and the second branch 427. The multiplexor output node 422 can be electrically connected to the tristate output stage 425 at the connecting node 423. The first branch 426 can include two PFETs 406-407 connected in series between the VDD rail and the connecting node 423. As illustrated, one of the two PFETs 406 in this first branch 426 can be a clock-gated transistor, which is controlled by $\overline{CLK}$. The other PFET 407 can be controlled by the voltage level on a tristate logic output node 445 of a tristate logic structure 442 in the first feedback path 440 (see detailed discussion below). The second branch 427 can include a PFET 405 and an NFET 404, which are connected in series between the VDD rail and an n-type clock-gated power supply transistor 403 that is connected to the VSS rail and controlled by $\overline{CLK}$. The first driver output node 429 can be located at the junction between the PFET 405 and NFET 404. Furthermore, the PFET 405 and the NFET 404 can be controlled by the voltage level on the connecting node 423. Thus, the first driver output signal at the first driver output node 429 will be dependent, in part, on the multiplexor output signal at the multiplexor output node 422 and also on $\overline{CLK}$. By making the first driver output signal at the first driver output node 429 data-dependent (i.e., dependent, in part, on the multiplexor output signal at the multiplexor output node 422), the need for multi-phase clock signals (i.e., both CLK and $\overline{CLK}$) within the first driver 420 is eliminated (i.e., only $\overline{CLK}$ is required for first driver operation). This reduces the load on the SOC clock tree and, thereby reduces dynamic power consumption.

In this SFF 400, the first feed-forward path 430 can include an inverter 433 connected in series between the first driver output node 429 of the first driver 420 of the first latch 410 and the second driver input node 461 of the second driver 460 of the second latch 450. The first feedback path 440 can include an inverter 441 and a tristate logic structure 442 connected in series with input and output nodes 444-445 electrically connected in a loop to first nodes 431-432 on the first feed-forward path 430 upstream of the inverter 433 (i.e., the inverter 433 is downstream of the first feedback path 440). As illustrated, the tristate logic structure 442 can include the n-type shared clock-gated power supply transistor 401. Furthermore, as mentioned above, the output node 445 of this tristate logic structure 442 can be electrically connected by an interconnect to the gate of the PFET 407 in the first branch 426 of the tristate output stage 425.

In this SFF 400, the second driver 460 can be an additional tristate logic structure. As illustrated, the tristate logic structure of the second driver 460 can include four stacked transistors including two PFETs 463 and 464 and two NFETs 465 and 401. One of these two PFETs (e.g., PFET 464) can be controlled by the voltage level at the second driver input node 461 (i.e., the voltage level at the output of the inverter 433 at one end of the first feed-forward path 433 opposite the first driver output node 429) and the other PFET can be a p-type clock-gated power supply transistor 463, which is connected to the VDD rail and controlled by $\overline{CLK}$). Similarly, one of the two NFETs (e.g., NFET 465) can be controlled by the voltage level at the second driver input node 461 and the other NFET can be the n-type shared clock-gated power supply transistor 401, which, as mentioned above, is connected to the VDD rail, controlled by CLK, and also incorporated into (i.e., shared by) the tristate logic structure 442 of the first feedback path 440 of the first latch 410.

The second feed-forward path 470 can include an inverter 471 connected in series between the second driver 460 and the third driver 490. The second feedback path 480 can include yet another tristate logic structure 481 with input and output nodes 482 and 483 connected to output and input nodes 473 and 472, respectively, of the inverter 471. Additionally, as illustrated, this tristate logic structure 481 can include four stacked transistors including two PFETs 485-486 and two NFETs 487-488. One of the two PFETs (e.g., PFET 485) can be controlled by the voltage level at the output node 473 of the inverter 471 and the other PFET (e.g., PFET 486) can be a p-type clock-gated transistor, which is controlled by CLK. Similarly, one of the two NFETs (e.g., NFET 488) can be controlled by the voltage level at the output node 473 of the inverter 471 and the other NFET (e.g., NFET 487) can be an n-type clock-gated transistor, which is controlled by $\overline{CLK}$.

The third driver 490 can be an inverter with, as mentioned above, a third driver input node 491 and a third driver output node 492 (i.e., a final output node), which output the final output signal (Q). The third driver input node 491 can be connected to the second feed-forward path 470 at the junction between the second feed-forward path 470 and the second feedback path 480 (i.e., at the junction between the inverter 471 and the tristate logic 481).

With this configuration, all transistors can be the same threshold voltage type. For example, all transistors in the first latch 410, in the second latch 450 and in the output driver 490 can be low threshold voltage (LVT) transistors.

In operation, when CLK switches to low and $\overline{CLK}$ switches to high, the first driver 420 of the first latch 410 and the tristate logic structure 481 of the second feedback path 480 turn on and the second driver 460 of the second latch 450 and the tristate logic structure 442 of the first feedback path 440 turn off. When the first driver 420 is on and the selected data value (D or SI) is high, a pull-down stage of the multiplexor stage will take over such that the voltage level on the multiplexor output node 422 will be pulled down (i.e., low). In this case, the voltage level at the connecting node 423 will also be pulled low because the PFET 406 of the first branch 426 of the tristate output stage 425 will be turned off. As a result, the PFET 405 will be turned on and the NFET 404 will be turned off, thereby pulling up the voltage level at the first driver output node 429 (i.e., the first driver output signal on the first driver output node 429 will be high). However, when the first driver 420 is on and the selected data value (D or SI) is low, a pull-up stage of the multiplexor will take over such that the voltage level on the multiplexor output node 422 will be pulled up (i.e., high). In this case, the voltage level at the connecting node 423 will also be pulled high. As a result, the PFET 405 will be turned off and the NFET 404 will be turned on, thereby pulling down the voltage level at the first driver output node 429 (i.e., the first driver output signal on the first driver output node 429 will be low).

The first feed-forward path 430 includes the inverter 433 connected in series between the first driver output node 429 and the second driver input node 461. Thus, the voltage level at the second driver input node 461 will be opposite that of the voltage level on the first driver output node 429. However, regardless of whether the voltage level at the second driver input node 461 is high or low, the second driver 460 is a tristate logic structure that is turned off when CLK is low and $\overline{CLK}$ is high (i.e., has a high impedance output state). Additionally, since the tristate logic structure 481 of the second feedback path 480 of the second latch 450 is on at this time, the voltage level (i.e., the state) at the third driver input node 491 will be maintained. Thus, the voltage level of the final output signal (Q) at the third driver output node 492 of the third driver 490, which corresponds to the state of the previously latched data input, will remain stable (i.e., Q will remain unchanged). It should be noted that the first feedback path 440, which includes the inverter 441 and tristate logic structure 442, will also receive the output signal from the first driver 420. However, regardless of the voltage level at the first driver output node 429, given that the tristate logic structure 442 in this first feedback path 340 is turned-off at this time, it will have a high impedance output state at the tristate logic output node 445.

When CLK switches to high and $\overline{CLK}$ switches to low, the first driver 420 of the first latch 410 and the tristate logic structure 481 of the second feedback path 480 of the second latch 450 turns off and the second driver 460 of the second latch 450 and the tristate logic structure 442 of the first feedback path 440 of the first latch 410 turn on. If the selected data value (D or SI) was high such that the voltage level at the first driver output node 429 was high and, due to the inverter 433, the voltage level at the second driver input node 461 was low when the second driver 460, which is a tristate logic structure, turned on, then the voltage level at the second driver output node 462 will be pulled up. In this case, the input to the inverter 471 in the second feed-forward path 470 will be high and the output from that inverter 471 will be low. As a result, the input to the third driver 490 (which is also an inverter) will be low and the final output signal (Q) will be high (i.e., Q will reflect D). If, however, the selected data value (D or SI) was low such that the voltage level at the first driver output node 429 was low and, due to the inverter 433, the voltage level at the second driver input node 461 was high when the second driver 460 turned on, the voltage level at the second driver output node 462 will be pulled down. In this case, the input to the inverter 471 in the second feed-forward path 470 will be low and the output of that inverter 471 will be high. As a result, the input to the third driver 490 (which is also an inverter) will be high and the final output signal (Q) will be low (i.e., Q will reflect D).

It should be noted that, since the first driver 420 is turned off and the tristate logic structure 442 in the first feedback path 440 is turned on at this time, changes in the voltage level (i.e., state) of the selected data input (D or SI) will not cause corresponding voltage level changes at the second driver input node 461. Furthermore, regardless of whether the voltage level at the second driver output node 462 is high or low when the second driver 460 is turned on, the tristate logic structure 481 of the second feedback path 480 is turned off and, thus, will have a high impedance output state. More particularly, since the tristate logic structure 442 in the first feedback path 440 is turned on at the same time the first driver 420 is turned off, changes in the voltage level (i.e., state) of the selected data input (D or SI) will not cause corresponding voltage level changes at the second driver input node 461. This is because, as mentioned above, the output node 445 of this tristate logic structure 442 in the first feedback path 440 is electrically connected by an interconnect to the gate of the PFET 407 in the first branch 426 of the tristate output stage 425. When the tristate logic structure 442 is off (i.e., when $\overline{CLK}$ is high), this tristate logic structure 442 has a high impedance output state. However, when this tristate logic structure 442 turns on (i.e., when $\overline{CLK}$ switches to low), the tristate output structure 442 will have a high or low output state depending upon the selected data value (D or SI) latched into the first latch 410. If the selected data value (D or SI) was low, the voltage level on the first driver output node 429 would also have been low. This low value feeds through the inverter 441 and tristate logic structure 442 to the output node 445, thereby turning on the PFET 407. The combined strength of the PFET 407 and the PFET 406 (which is also on because $\overline{CLK}$ is low) ensures that the voltage level on the connecting node 423 continues to be pulled up, keeping PFET 405 off and preventing the voltage level on the first driver output node 429 from being pulled up. On the other hand, when this tristate logic structure 442 turns on (i.e., when $\overline{CLK}$ switches to low), if the selected data value (D or SI) was high, the voltage level on the first driver output node 429 would also have been high. This high value feeds through the inverter 441 and tristate logic structure 442 to the output node 445, thereby turning off the PFET 407. Turning off the PFET 406 (even with the PFET 407 turned on) prevents the voltage level on the connecting node 423 from being pulled up, keeping the NFET 404 off and preventing the voltage level on the first driver output node 429 from being pulled down.

Thus, once $\overline{CLK}$ switches to low, the selected data input (D or SI) can change values. For example, the selected data value (D or SI) can change from low to high thus turning off the pull up path of the multiplexer. The data dependent feedback from voltage level on the first driver output node 429 that is feed through the first feedback path 440 and controls the PFET 407 allows the removal of clock gating in the pull path of the multiplexer thus saving on CLK input capacitance from a large clock gating device in that path. Additionally it gives a better delay from the selected data input (D or SI) to the nodes 422 and 423. The PFETs 406 and 407 are meant to just hold the high value at multiplexor and connecting nodes 422 and 423 against leakage and noise. Hence, they can be minimum sized.

By employing the combination of data and clock-dependent gating in tristate output stage of the first driver 420 to eliminate the need for multi-phase clock signals within the first driver and by incorporating at least one clock-gated power supply transistor 401, a reduced number of input clock pins may be employed to drive the SFF 400 as compared to prior art SFFs, thereby reducing the load on the clock tree and the dynamic power consumption of SOC.

It should be understood that the SFF structure embodiments 200-400 described in detail above and illustrated in FIGS. 2-4 are provided for illustration purposes and are not intended to be limiting. Various modifications will be apparent to those skilled in the art.

Figure 5:
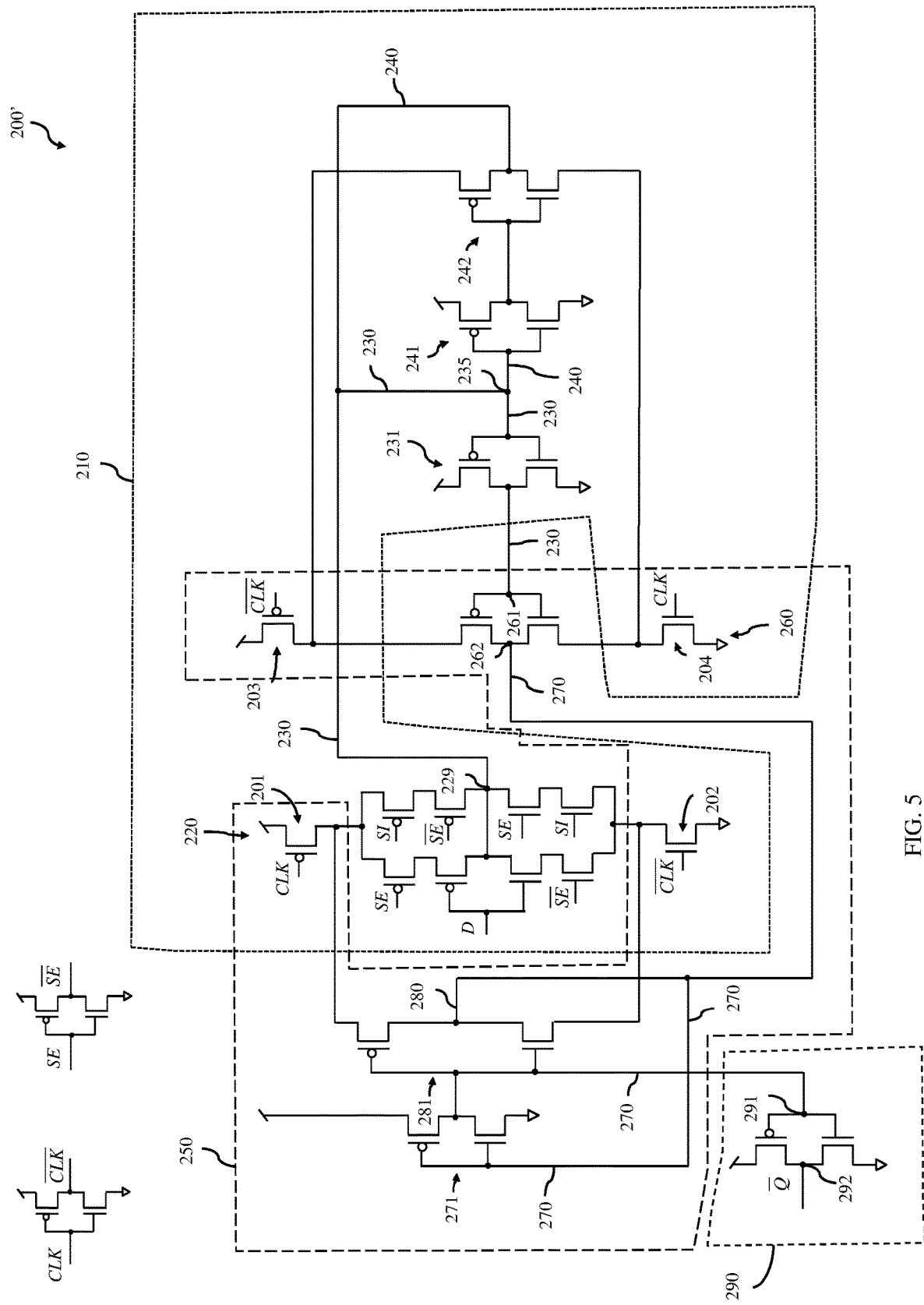
FIG. 5 is a schematic diagram illustrating another embodiment of a low-power SFF where the SFF of FIG. 2 is modified to output $\overline{Q}$.
Figure 6:
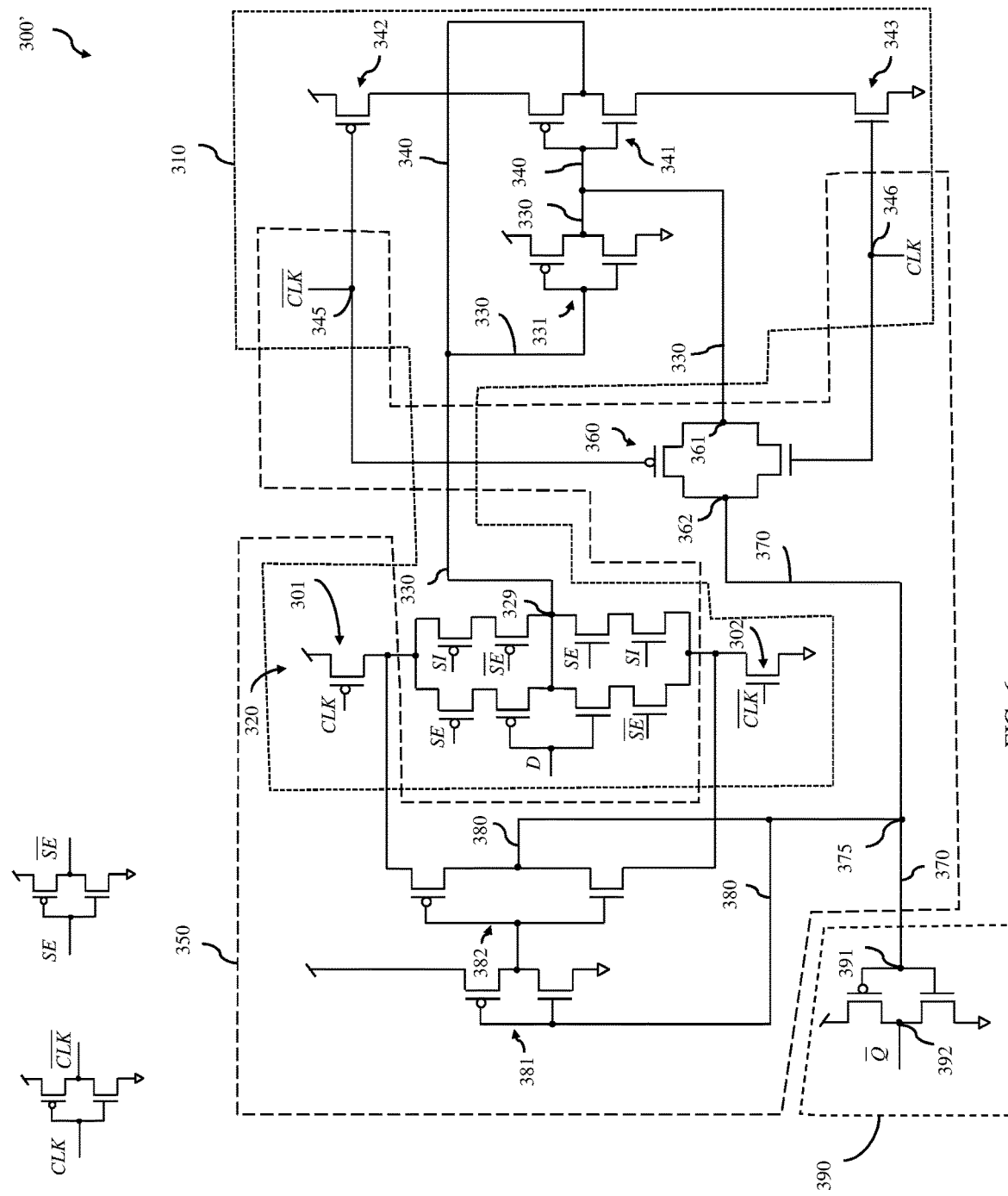
FIG. 6 is a schematic diagram illustrating another embodiment of a low-power SFF where the SFF of FIG. 3 is modified to output $\overline{Q}$.
Figure 7:
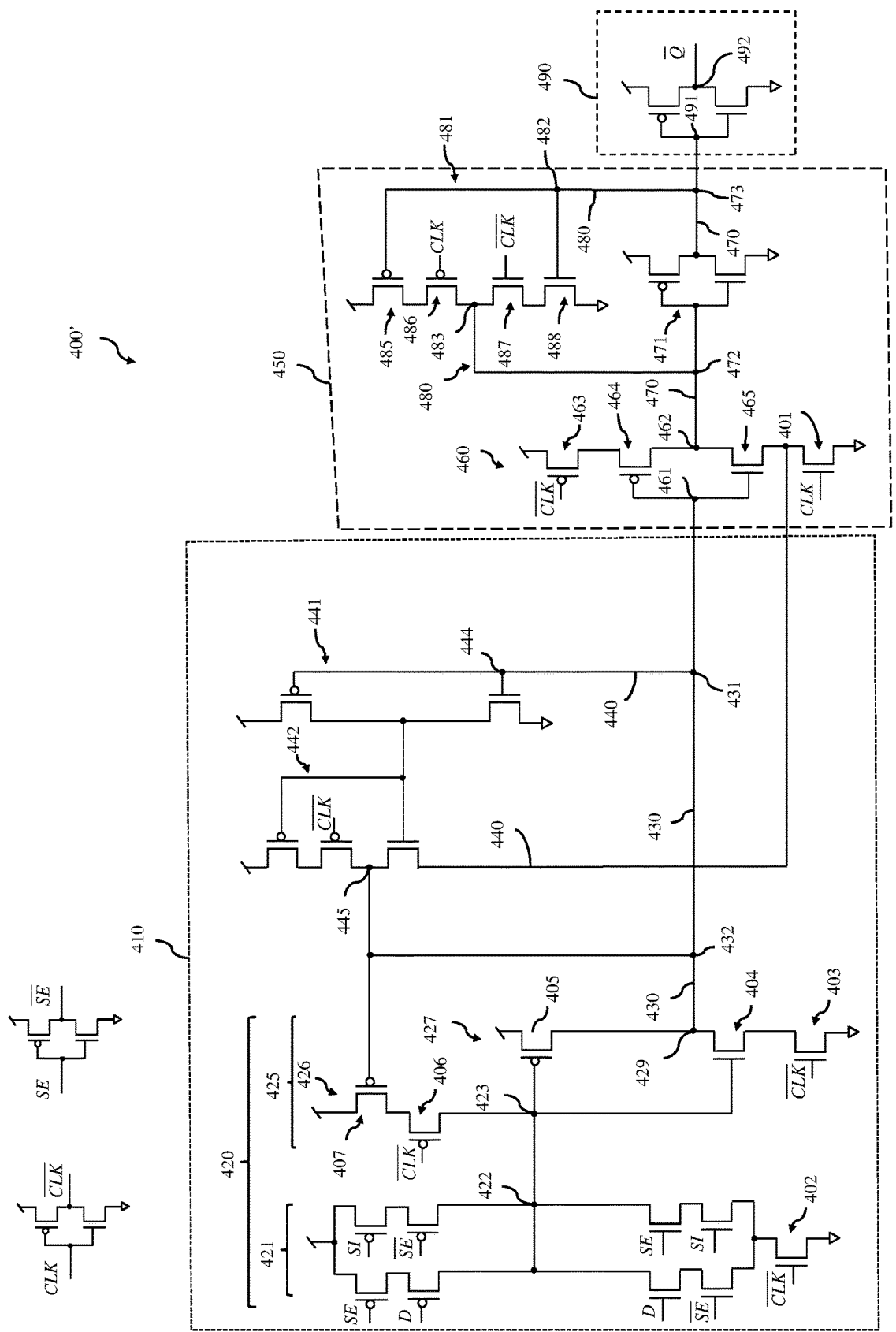
FIG. 7 is a schematic diagram illustrating another embodiment of a low-power SFF where the SFF of FIG. 4 is modified to output $\overline{Q}$.

For example, FIGS. 5, 6 and 7 are illustrations of alternative SFF structure embodiments 200', 300' and 400', wherein minor modifications have been made to the SFF structure embodiments 200, 300, 400 of FIGS. 2, 3 and 4, respectively, so that the final output signal from the third driver 290, 390, 490 is Q and not Q (i.e., where the selected data input and the final output signal have opposite polarity). Specifically, the SFF structure 200' shown in FIG. 5 is essentially the same as the SFF structure 200 shown in FIG.

2 except that a single inverter 231 has been inserted into the first feed-forward path 230 so that it is connected in series between the first driver output node 229 and the second driver input node 261 upstream of the first feedback path 240. The SFF structure 300' shown in FIG. 6 is essentially the same as the SFF structure 300 shown in FIG. 3 except that the inverter 332, which was connected in series between the inverter 331 and the second driver 360 upstream of the first feedback path 340, has been removed from the first feed-forward path 330. Similarly, the SFF structure 400' shown in FIG. 7 is essentially the same as the SFF structure 400 shown in FIG. 4 except that the inverter 433, which was in the first feed-forward path 430 connected in series between the first driver 420 and the second driver 460 upstream of the first feedback path 440, has been removed from the first feed-forward path 430. In each of these SFF structures 200', 300' and 400', the result is that if the selected data input (D or SI) is high, the final output signal will be low and vice versa. It should be noted that in the SFF structures 300' and 400', removal of the inverter, as discussed above, will also result in a slight reduction in power consumption in the data path and a slight area consumption reduction. However, in a SoC, the output is often clubbed with other logic functions. The requirement of output polarity to be same as the D input is often not a critical requirement when we consider the large number of instances on an SoC where either polarity is used by downstream logic. This requirement is accommodated by inverting outside the flip-flop cell or by matching the logic outside to this polarity (e.g., using a NAND gate instead of a NOR gate (or vice versa) in the downstream logic. In other words, a SOC can be designed such that the mismatch in polarity between the input and output of the SFF structures 200', 300' and 400' will not in limit structural advantages to performance and power.

Figure 8:
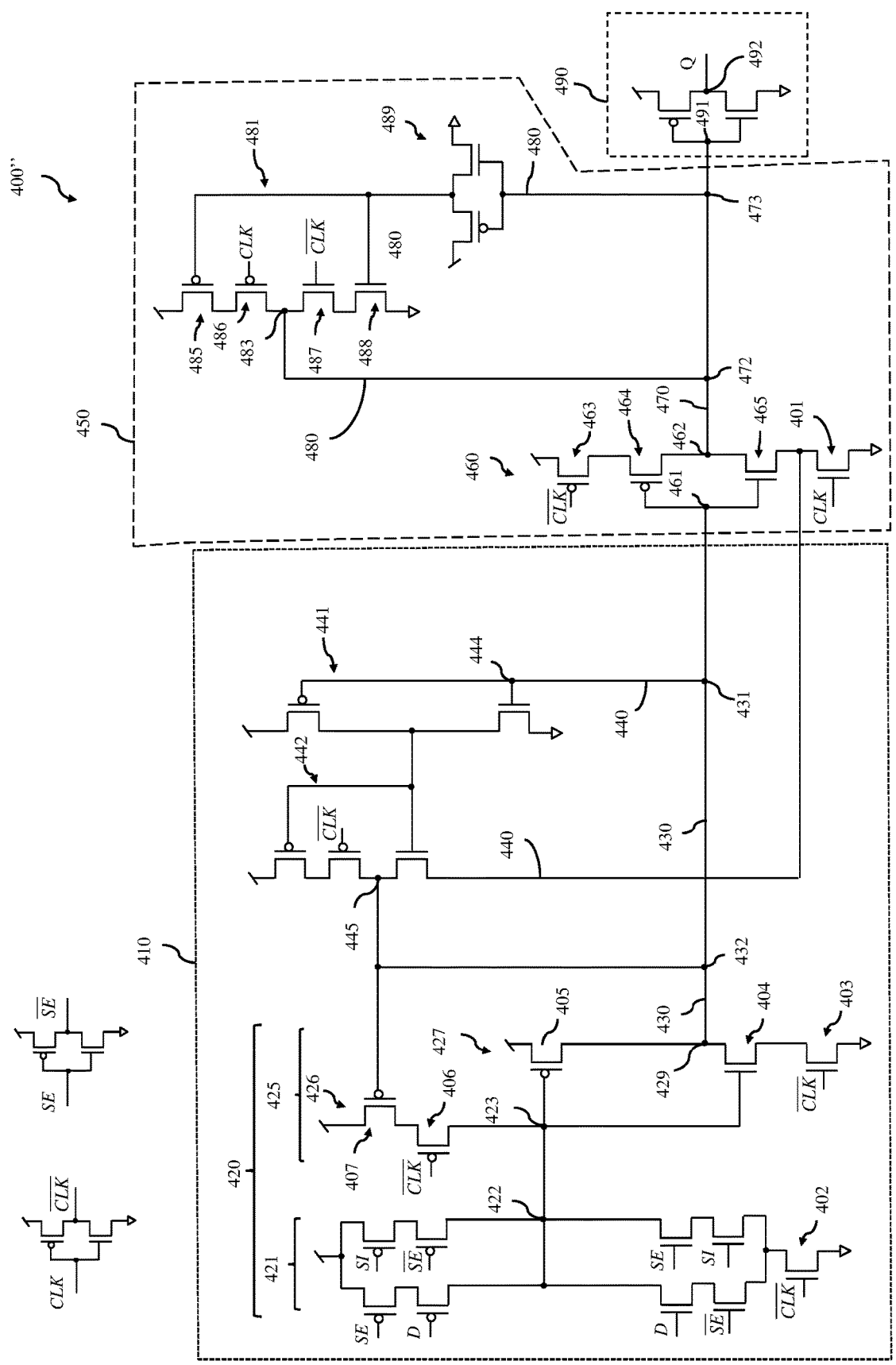
FIG. 8 is a schematic diagram illustrating yet another embodiment of a low-power SFF where the SFF of FIG. 4 is alternatively modified to further reduce power and/or area consumption.

Other modifications can, for example, include variations in the number and/or placement of devices within the feedback and/or feed-forward paths to further reduce area and/or power consumption and achieve the desired output. For example, FIG. 8 is an illustration of yet another alternative SFF structure embodiment 400" similar to the SFF structure embodiment 400 of FIG. 4 except that: (1) the inverter 433, which was in the first feed-forward path 430 connected in series between the first driver 420 and the second driver 460 upstream of the first feedback path 440, has been removed; (2) the inverter 471, which was in the second feed-forward path 470 connected in series between the second driver 460 and the third driver 490 has been removed to ensure that the final output signal reflects the selected data input (D or SI) (i.e., to ensure that the final output signal is Q); and (3) an additional inverter 489 has been inserted into the second feedback path 480 upstream of the tristate logic structure 481 (i.e., before the input node 482 to the tristate logic structure 481) to ensure that the voltage level at the output node 483 of the tristate logic structure 481 is the same as the voltage level at the second driver output node 462, when the tristate logic structure 481 is turned on (i.e., when CLK is low and $\overline{CLK}$ is high).

Therefore, disclosed above are embodiments of a scan flip-flop (SFF) configured to reduce the dynamic power consumption of a system-on-chip (SOC) that incorporates a large number of such SFFs. To achieve this reduction in the dynamic power consumption, the SFF embodiments reduce the load on the SOC clock tree by incorporating one or more shared clock-gated power supply transistors. Specifically, each SFF embodiment can include a master latch and a slave latch. These latches can be driven by a combination of a clock signal and an inverted clock signal and each latch can include a driver, a feed-forward path and a feedback path. Each SFF embodiment can also include at least one shared clock-gated power supply transistor, which is controlled by a given clock signal (e.g., either the clock signal or the inverted clock signal) in order to selectively and simultaneously connect a given voltage rail (e.g., a power voltage rail or a ground voltage rail) to both the driver from one latch or the feedback path of the other latch. The different SFF embodiments disclosed herein have different numbers of shared clock-gated power supply transistors and various other differences designed for optimal power and/or performance including, but not limited to, different types of slave latch drivers (e.g., a transmission gate driver or tristate logic driver), different types of transistors (e.g., a combination of super low threshold voltage (SLVT) and low threshold voltage (LVT) transistors or LVT transistors only), and/or different types of master latch drivers (e.g., a single-stage, multiple clock phase-dependent driver or a multi-stage, single clock phase-dependent driver).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A flip-flop comprising:
    a first latch comprising: a first driver having a first driver output node; a first feed-forward path; and a first feedback path;
    a second latch comprising: a second driver having a second driver input node and a second driver output node; a second feed-forward path; and a second feedback path;
    a third driver comprising a third driver input node and a third driver output node,
        wherein the first feed-forward path connects the first driver output node to the second driver input node,
        wherein the first feedback path is connected to at least one first node on the first feed-forward path,
        wherein the second feed-forward path connects the second driver output node to the third driver input node, and
        wherein the second feedback path is connected to at least one second node on the second feed-forward path; and
    at least one shared clock-gated power supply transistor comprising a first source/drain terminal connected to a voltage rail and a second source/drain terminal connected to one driver and to one feedback path for different ones of the first latch and the second latch.

2. The flip-flop of claim 1, further comprising multiple shared clock-gated power supply transistors.

3. The flip-flop of claim 2, wherein the multiple shared clock-gated power supply transistors and all first driver transistors have a lower threshold voltage than all other transistors of the first latch, the second latch and the third driver.

4. The flip-flop of claim 2, wherein the multiple shared clock-gated power supply transistors comprise:

a first p-type shared clock-gated power supply transistor connecting a positive voltage rail to the first driver and the second feedback path and being controlled by a clock signal;

a first n-type shared clock-gated power supply transistor connecting a ground voltage rail to the first driver and the second feedback path and being controlled by an inverted clock signal;

a second p-type shared clock-gated power supply transistor connecting the positive voltage rail to the second driver and the first feedback path and being controlled by the inverted clock signal; and a second n-type shared clock-gated power supply transistor connecting the ground voltage rail to the second driver and the first feedback path and being controlled by the clock signal.

5. The flip-flop of claim 4,
wherein the first feedback path comprises an inverter and a tristate logic structure connected in series with input and output nodes connected to a first node of the first feed-forward path at one end connected to the second driver input node,
wherein the second driver comprises an additional tristate logic structure, and
wherein the second p-type shared clock-gated power supply transistor and the second n-type shared clock-gated power supply transistor are shared by the tristate logic structure of the first feedback path and the additional tristate logic structure of the second driver.

6. The flip-flop of claim 4,
wherein the second feed-forward path comprises an inverter,
wherein the second feedback path comprises a tristate logic structure with input and output nodes connected to output and input nodes, respectively, of the inverter, and
wherein the first p-type shared clock-gated power supply transistor and the first n-type shared clock-gated power supply transistor are shared by the first driver and the tristate logic structure of the second feedback path.

7. A flip-flop comprising:
a first latch comprising: a first driver having a first driver output node; a first feed-forward path; and a first feedback path;
a second latch comprising: a second driver comprising a transmission gate and having a second driver input node and a second driver output node; a second feed-forward path; and a second feedback path;
a third driver comprising a third driver input node and a third driver output node,
wherein the first feed-forward path connects the first driver output node to the second driver input node,
wherein the first feedback path is connected to at least one first node on the first feed-forward path,
wherein the second feed-forward path connects the second driver output node to the third driver input node, and
wherein the second feedback path is connected to at least one second node on the second feed-forward path; and
at least one shared clock-gated power supply transistor comprising a first source/drain terminal connected to a voltage rail and a second source/drain terminal connected to the first driver and the second feedback path.

8. The flip-flop of claim 7, further comprising multiple shared clock-gated power supply transistors, multiple non-shared clock-gated power supply transistors, and multiple additional clock-gated transistors.

9. The flip-flop of claim 8, wherein all clock-gated transistors, all first driver transistors and all second driver transistors have a lower threshold voltage than all other transistors of the first latch, the second latch and the third driver.

10. The flip-flop of claim 8, wherein the multiple shared clock-gated power supply transistors comprise:
a p-type shared clock-gated power supply transistor connecting a positive voltage rail to the first driver and the second feedback path and being controlled by a clock signal; and
an n-type shared clock-gated power supply transistor connecting a ground voltage rail to the first driver and the second feedback path and being controlled by an inverted clock signal.

11. The flip-flop of claim 10,
wherein the multiple non-shared clock-gated power supply transistors comprise:
a p-type power supply transistor connecting a positive voltage rail to the first feedback path; and
an n-type power supply transistor connecting a ground voltage rail to the first feedback path, and
wherein the multiple additional clock-gated transistors comprise:
a p-type transistor of a transmission gate, wherein the p-type power supply transistor and the p-type transistor of the transmission gate are controlled by an inverted clock signal on a shared inverted clock signal node; and
an n-type transistor of the transmission gate, wherein the n-type power supply transistor and the n-type transistor of the transmission gate are controlled by a clock signal on a shared clock signal node.

12. The flip-flop of claim 11,
wherein the first feed-forward path comprises a first inverter and a second inverter connected in series between the first driver and the second driver, and
wherein the first feedback path comprises a tristate logic structure with input and output nodes connected to output and input nodes, respectively, of the first inverter such that the second inverter is downstream of the first feedback path.

13. The flip-flop of claim 11,
wherein the second feedback path comprises an inverter and a tristate logic structure connected in series with input and output nodes connected to a second node of the second feed-forward path at one end connected to the third driver input node, and
wherein the first driver and the tristate logic structure of the second feedback path share the p-type shared clock-gated power supply transistor and the n-type shared clock-gated power supply transistor.

14. A flip-flop comprising:
a first latch comprising:
a multi-stage, single clock phase-dependent, first driver comprising:
a multiplexor stage having a multiplexor output node; and
a tristate output stage having a first driver output node, wherein a first driver output signal at the first driver output node is dependent, in part, on a multiplexor output signal at the multiplexor output node;
a first feed-forward path; and
a first feedback path;

a second latch comprising: a second driver having a second driver input node and a second driver output node; a second feed-forward path; and a second feedback path;

a third driver comprising a third driver input node and a third driver output node, wherein the first feed-forward path connects the first driver output node to the second driver input node, wherein the first feedback path is connected to at least one first node on the first feed-forward path, wherein the second feed-forward path connects the second driver output node to the third driver input node, and wherein the second feedback path is connected to at least one second node on the second feed-forward path; and an n-type shared clock-gated power supply transistor comprising a first source/drain terminal connected to a ground voltage rail and a second source/drain terminal connected to the second driver and the first feedback path, wherein the n-type shared clock-gated power supply transistor is controlled by a clock signal.

15. The flip-flop of claim 14, wherein all transistors in the flip-flop are same type threshold voltage transistors.

16. The flip-flop of claim 14, wherein the multiplexor output node is connected to the tristate output stage at a connecting node, wherein the multiplexor stage has inputs including a data signal, a scan enable signal, an inverted scan enable signal, and a scan-in signal, wherein the tristate output stage comprises a first branch and a second branch, wherein the first branch comprises two p-type transistors connected in series between a positive voltage rail and the connecting node, wherein one of the two p-type transistors in the first branch is clock-gated and controlled by an inverted clock signal, wherein the second branch comprises a p-type transistor and an n-type transistor connected in series between the positive voltage rail and a n-type clock-gate power supply transistor that is controlled by the inverted clock signal, wherein the first driver output node is at a junction between the p-type transistor and the n-type transistor of the second branch, and wherein the p-type transistor and the n-type transistor of the second branch are controlled by a voltage level at the connecting node such that the first driver output signal at the first driver output node is dependent, in part, on the multiplexor output signal at the multiplexor output node.

17. The flip-flop of claim 16, wherein the first feed-forward path comprises an inverter, wherein the first feedback path is upstream of the inverter of the first feed-forward path and comprises another inverter connected in series to a tristate logic structure, wherein a tristate logic output node of the tristate logic structure in the first feedback path further controls one of the p-type transistors of the first branch of the tristate output stage of the first driver to ensure that, when the first latch is turned off and the second latch is turned on, voltage levels on the connecting node and the first driver output node remain essentially constant and are independent of variations in a selected data input, wherein the second driver comprises an additional tristate logic structure, and wherein the tristate logic structure of the first feedback path and the additional tristate logic structure of the second driver share the n-type shared clock-gated power supply transistor.

18. The flip-flop of claim 14, wherein the second feed-forward path comprises an inverter, and wherein the second feedback path comprises a tristate logic structure with input and output nodes connected to output and input nodes, respectively, of the inverter.

19. The flip-flop of claim 14, further comprising multiple non-shared clock-gated power supply transistors comprising:

two n-type clock-gated power supply transistors for the multiplexor stage and the tristate output stage, respectively, of the first driver and controlled by an inverted clock signal; and a p-type clock-gated power supply transistor for the second driver and controlled by the inverted clock signal.

20. The flip-flop of claim 14, further comprising additional clock-gated transistors comprising:

two p-type clock-gated transistors incorporated into the tristate output stage of the first driver and the first feedback path, respectively, and controlled by an inverted clock signal; and, p-type and n-type clock-gated transistors incorporated into the second feedback path and controlled by clock and inverted clock signals, respectively.

* * * * *